(12) United States Patent
Chan et al.

(10) Patent No.: US 8,536,919 B1
(45) Date of Patent: Sep. 17, 2013

(54) INTEGRATED CIRCUITS WITH DELAY MATCHING CIRCUITRY

(75) Inventors: Allen Chan, San Jose, CA (US); Wilson Wong, San Francisco, CA (US)

(73) Assignee: Altera Corporation, San Jose, CA (US)

( * ) Notice: Subject to any disclaimer, the term of this patent is extended or adjusted under 35 U.S.C. 154(b) by 111 days.

(21) Appl. No.: 12/909,781

(22) Filed: Oct. 21, 2010

(51) Int. Cl.
*H03K 3/00* (2006.01)

(52) U.S. Cl.
USPC ............................ 327/218; 327/199; 327/219

(58) Field of Classification Search
USPC ................. 327/199, 200, 202, 212, 218, 219, 327/262, 284
See application file for complete search history.

(56) References Cited

U.S. PATENT DOCUMENTS

| | | | |
|---|---|---|---|
| 4,719,365 A | | 1/1988 | Misono |
| 4,929,850 A | * | 5/1990 | Breuninger .................... 327/198 |
| 5,376,848 A | | 12/1994 | Hanke, III et al. |
| 6,873,187 B1 | | 3/2005 | Andrews et al. |
| 6,930,522 B2 | | 8/2005 | Chang |
| 7,002,390 B2 | | 2/2006 | Florescu |
| 7,583,103 B2 | | 9/2009 | Lewis et al. |
| 7,747,917 B2 | * | 6/2010 | Putman et al. ................. 327/202 |
| 2009/0079483 A1 | * | 3/2009 | Keskin et al. ................. 327/161 |

OTHER PUBLICATIONS

Ravi, Ajay K., et al., U.S. Appl. No. 12/814,344, filed Jun. 11, 2010.
Lewis, David, U.S. Appl. No. 12/753,834, filed Apr. 2, 2010.

* cited by examiner

*Primary Examiner* — Long Nguyen
(74) *Attorney, Agent, or Firm* — Treyz Law Group; Jason Tsai (57) ABSTRACT

Integrated circuits with communications circuitry are provided. The communications circuitry may include at least first and second flip-flops connected in a chain along a data path. The first flip-flop may be controlled by a clock signal. The clock signal may be fed to a delay matching circuit. The delay matching circuit may provide a delayed version of the clock signal that controls the second flip-flop. The delay provided by the delay matching circuit may be equal to a clock-to-output delay of the first flip-flop. The delay matching circuit may have the same physical arrangement as the first flip-flop. The first and second flip-flops and the delay matching circuit may include dynamic sense amplifier flip-flops. The delay matching circuit may have an input that receives a high signal, a control input that receives the clock signal, and an output over which the delayed clock signal is provided.

20 Claims, 12 Drawing Sheets

(PRIOR ART)
FIG. 1

(PRIOR ART)

FIG. 2

(PRIOR ART)

| S | R | ACTION |
|---|---|--------|
| 0 | 0 | KEEP STATE |
| 0 | 1 | Q=0 |
| 1 | 0 | Q=1 |
| 1 | 1 | RESTRICTED |

INTEGRATED CIRCUITS WITH DELAY MATCHING CIRCUITRY

BACKGROUND

This relates generally to integrated circuits and more particularly, to integrated circuits with flip-flops.

Integrated circuits often include communications circuitry such as transceiver circuitry. The transceiver circuitry sometimes includes flip-flops connected in a chain. The flip-flops are controlled by a single clock signal. Data is transferred from one flip-flop in the chain to a successive flip-flop in the chain as the clock signal oscillates.

A pair of consecutive flip-flops in the chain may include a positive edge-triggered flip-flop and a negative edge-triggered flip-flop. For example, consider a scenario in which a first positive edge-triggered flip-flop and a second negative edge-triggered flip-flop are connected in series. The first flip-flop has a first data input, a first data output, and a first clock input, whereas the second flip-flop has a second data input, a second data output, and a second clock input. The first data input receives data signals. The first data output is connected to the second data input. The first and second clock inputs receive a clock signal.

When the clock signal rises from low to high, data at the first data input is transferred to the first data output after a clock-to-output delay. When the clock signal falls from high to low, data at the second data input may be transferred to the second data output after a clock-to-output delay (i.e., data at the second data input may be latched by the second flip-flop).

As the data rate for transceiver circuitry increases, the clock period decreases. For data rates greater than 20 Gbps (as an example), the clock-to-output delay may take up a significant portion of the clock period (i.e., the clock-to-output delay may be greater than a quarter clock cycle). In such scenarios, variations such as process, voltage, and temperature variations, power supply noise, device mismatch, and other sources of variations may cause the second flip-flop to latch incorrect data.

It would therefore be desirable to be able to provide improved flip-flop circuitry that can properly latch desired data in the presence of variations.

SUMMARY

Integrated circuits may include communications circuitry. The communications circuitry may include flip-flips connected in a chain. The flip-flops may, for example, serve to transfer data serially in a transmit data path.

For example, the communications circuitry may include at least first and second flip-flops (sometimes referred to as registers or data storage elements) connected in series. The first flip-flop may be a positive edge-triggered flip-flop, whereas the second flip-flop may be a negative edge-triggered flip-flop. The first and second flip-flops may each have a data input, a data output, and a clock input. The data output of the first flip-flop may be connected to the data input of the second flip-flop.

The control input of the first flip-flop may receive a clock signal (e.g., a square-wave clock signal with 50% duty cycle). Data may be presented to the data input of the first flip-flop. When the clock signal rises from low to high, the latched data may appear at the output of the first flip-flop after a clock-to-output delay.

The clock signal may be fed to a delay circuit (e.g., a delay matching circuit). The delay matching circuit may include a flip-flop-like circuit. The physical design of the delay circuit may be the same as the physical design of the first flip-flop (i.e., the delay circuit may be associated with the first flip-flop).

The delay circuit may have a data input, a control input, and a data output. The clock signal may be fed to the control input of the delay circuit. The data input of the delay circuit may be connected to a positive power supply line. A delayed version of the clock signal may be generated at the data output of the delay circuit. The delayed clocks signal may be fed to the clock input of the second flip-flop. The delay circuit may therefore serve as a buffer that delays the clock signal by a time delay that is equal to the clock-to-output delay of the first flip-flop. Delaying the clock signal using this approach ensures that the second flip-flop will be able to latch data properly in the presence of systematic/environmental variations, power supply noise, device mismatch, various submicron effects, etc.

The first and second flip-flops and the delay circuit may include dynamic sense-amplifier flip-flop circuits. A sense-amplifier flip-flop may include a sense amplifier and a set-reset (SR) latch connected in series. The sense amplifier may generate appropriate set and reset signals to the SR latch during normal operation.

The sense amplifier of the delay circuit may have an input that is connected to the positive power supply line. The sense amplifier of the delay circuit may generate a set signal and a reset signal. The set and reset signal may be forced to have opposite values. Configured in this way, the delay circuit may serve as a buffer that delays the clock signal by the clock-to-output delay through the sense amplifier and latch combination.

Further features of the present invention, its nature and various advantages will be more apparent from the accompanying drawings and the following detailed description.

DETAILED DESCRIPTION

This relates to integrated circuits with communications circuitry. The communications circuitry may be used on any suitable type of integrated circuits such as digital signal processors, microprocessors, application-specific integrated circuits, programmable circuits, etc.

Figure 1:
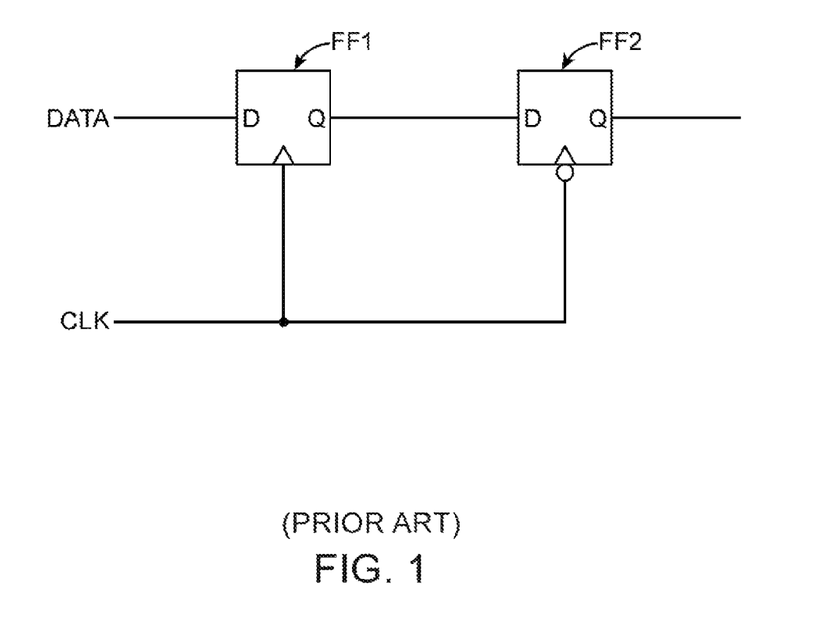
FIG. 1 is a diagram of a positive edge-triggered flip-flop and a negative edge-triggered flip-flop connected in series.

FIG. 1 shows conventional communications circuitry that includes flip-flops FF1 and FF2 connected in series. Flip-flop FF1 is a positive edge-triggered flip-flop, whereas flip-flop FF2 is a negative edge-triggered flip-flop. Flip-flop FF1 has a first data input, a first data output, and a clock input. Flip-flop FF2 has a second data input, a second data output, and a clock input. The first data output of flip-flop FF1 is connected to the second data input of flip-flop FF2. Flip-flops FF1 and FF2 are controlled by clock signal CLK (i.e., the clock inputs of flip-flops FF1 and FF2 receive CLK).

Signal DATA is provided at the first data input of flip-flop FF1. When signal CLK rises from low to high, positive edge-triggered flip-flop FF1 latches signal DATA and presents the latched data at its output. Signals on the first data output is fed to the second data input of flip-flop FF2. When signal CLK falls from high to low, negative edge-triggered flip-flop FF2 attempts to latch signal DATA present at its input. Depending on the clock rate, flip-flop FF2 may not latch data properly.

Figure 2:
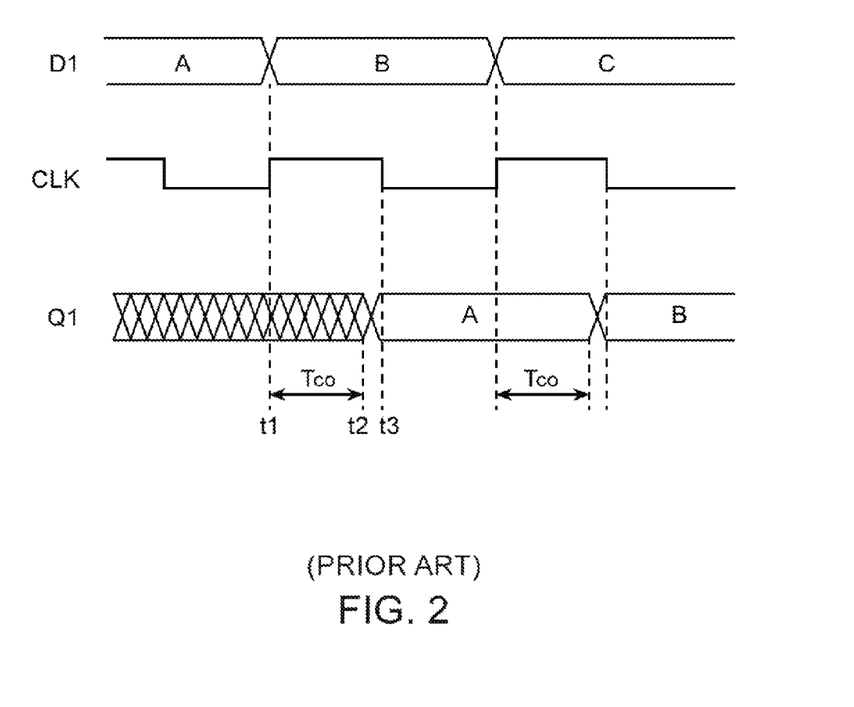
FIG. 2 is a timing diagram showing the behavior of relevant signals during operation of the flip-flops in FIG. 1.

FIG. 2 is a timing diagram that shows a scenario in which flip-flop FF2 may fail to latch desired data. As shown in FIG. 2, data A is initially presented at the first data input (i.e., signal D1 has a value of A), and the value at the first data output is unknown (i.e., the value of signal Q1 is unknown).

At time t1, clock signal CLK clocks high (i.e., CLK rises from low to high) and triggers flip-flop FF1 to latch data A. At time t2, signal A appears at output Q1 of flip-flop FF1. The amount of delay from the rising edge of signal CLK to the time at which signal A appears at the first data output (i.e., the time delay between t1 and t2) is referred to as clock-to-output delay Tco. At time t3, clock signal CLK clocks low (i.e., CLK falls from high to low) and triggers flip-flop FF2 to latch data A at its input D2.

As communications circuitry advances towards higher data rates (e.g., data rates greater than 20 Gbps), the clock period decreases accordingly. Clock-to-output delay Tco is a characteristic parameter of a flip-flop and is independent of the data rate (i.e., a given flip-flop has a fixed clock-to-output delay). Therefore, as clock period decreases, clock-to-output delay Tco may take up a larger percentage of the clock period (clock cycle).

As shown in FIG. 2, clock-to-output delay Tco can be greater than a quarter clock cycle. It is generally desirable for data presented at an input of a flip-flop to be stable as early as possible prior to a triggering clock edge. For example, it is desirable to increase the time between t2 and t3 so that flip-flop FF2 has sufficient setup time to latch data properly. However, variations such as process, voltage, and temperature variations, power supply noise, sub-micron effects, and other sources of variations during operation of the conventional communications circuitry may result in insufficient setup time (i.e., time t2 may be too close to t3 or t2 may occur after t3). Variations may therefore cause the conventional communications circuitry operating at high data rates to malfunction.

Figure 3:
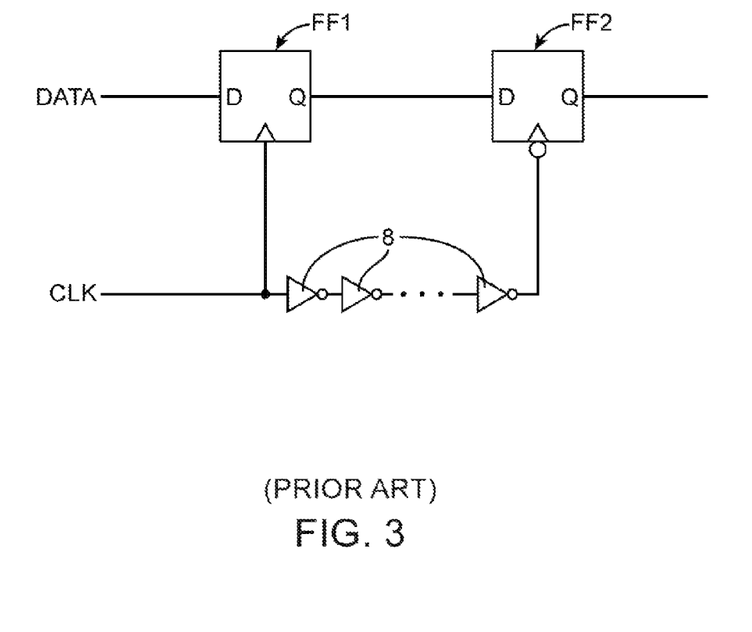
FIG. 3 is a diagram showing two series-connected flip-flops and a clock-inverter-delay chain.

Delay chain circuits have been used to increase the setup time of a receiving flip-flop. As shown in FIG. 3, a delay chain circuit with an even number of inverters 8 is connected between the clock input of flip-flop FF1 and the clock input of flip-flop FF2. The delay through inverters 8 can be tuned such that the delay through inverters 8 is approximately equal to clock-to-output delay Tco.

It is nevertheless challenging to ensure that the delay through inverters 8 matches clock-to-output delay Tco, because the flip-flops and the delay chain circuit have different circuit layout arrangements. Layout variations, device mismatch, variations in metallization capacitance, and other submicron effects (e.g., mismatch and variations in length of diffusion, oxide density, poly density, etc.) in the flip-flops and inverters 8 may undesirably degrade the setup time.

Moreover, using inverter delay chains to provide delay matching is not portable among different process technologies. For example, the inverter delay chain will have to be retuned when transitioning from an older process technology (e.g., 45 nm complementary metal-oxide-semiconductor technology) to a newer process technology (e.g., 28 nm complementary metal-oxide-semiconductor technology).

Figure 4:
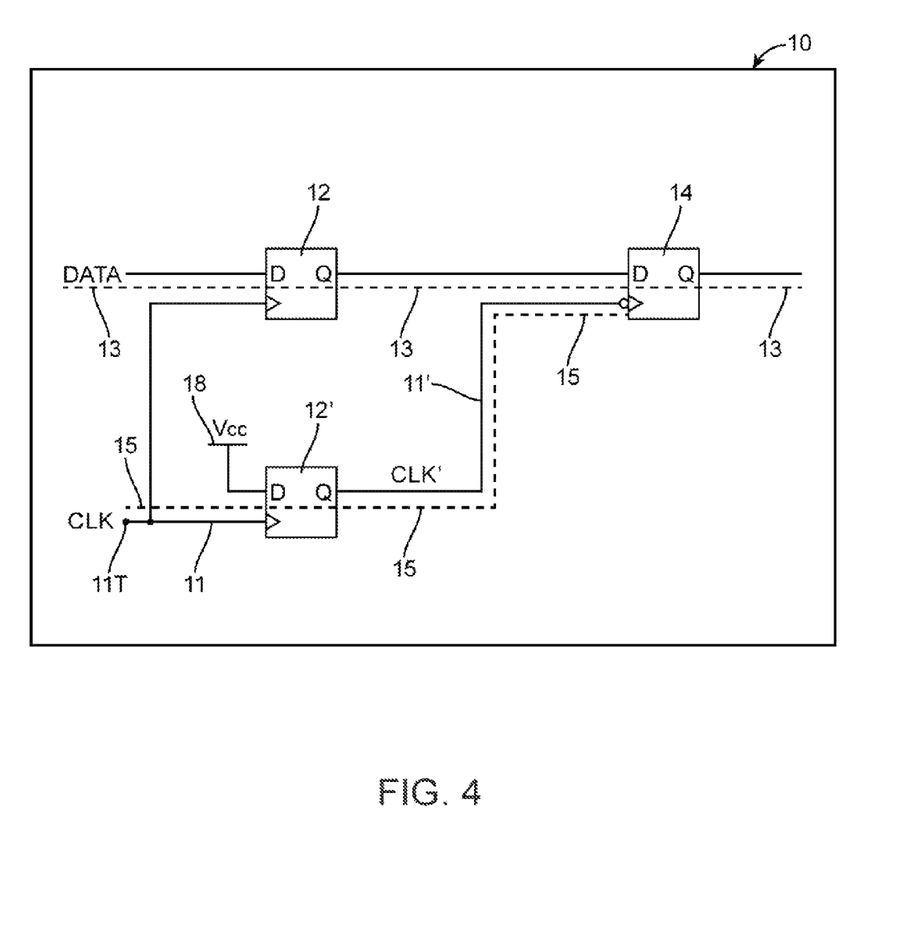
FIGS. 4 and 5 are diagrams of an illustrative integrated circuit with flip-flops and delay matching circuitry in accordance with an embodiment of the present invention.

An integrated circuit may include a flip-flop-like circuit in a clock delay path that accurately matches the clock-to-output delay of a given flip-flop in a data path with the delay through the flip-flop-like circuit that is associated with the given flip-flop. As shown in FIG. 4, device 10 may include flip-flops such as flip-flops 12 and 14 in data path 13 and a delay circuit such as flip-flop-like circuit 12' in clock control path 15. Flip-flop circuits 12 and 14 may sometimes be referred to as a storage element, a data register, a storage unit, etc. Clock delay circuit 12' is preferably formed using circuit components and a circuit layout that closely matches flip-flop circuits 12 and 14. Delay circuit 12' may therefore sometimes be referred to as a flip-flop-like circuit, a data register delay circuit, a flip-flop-type delay circuit, a sense-amplifier-based flip-flop, etc. Because delay circuit 12' has a design that is close to that of flip-flops 12 and 14, the timing properties of delay circuit 12' will accurately track the timing properties of flip-flops 12 and 14 across variations in process, voltage, and temperature (so-called PVT variations).

Flip-flop 12 may be a positive edge-triggered flip-flop, whereas flip-flop 14 may be a negative edge-triggered flip-flop (as an example). If desired, flip-flops 12 and 14 may both be positive edge-triggered flip-flops or both negative edge-triggered flip-flops. If desired, flip-flop 12 may be a negative edge-triggered flip-flop, whereas flip-flop 14 may be a positive edge-triggered flip-flop. Flip-flops 12 and 14 and delay circuit 12' may each have a data input, a data output, and a clock input.

Flip-flops 12 and 14 in data path 13 may be arranged in a chain. The data output of flip-flop 12 may be connected to the data input of flip-flop 14. The clock input of flip-flop 12 may receive a clock control signal CLK over control line 11 from clock terminal 11T. Terminal 11T may receive clock signal CLK from an internal clock source or from an external source. Signal CLK may be a square-wave clock signal with a 50% duty cycle (as an example). When CLK rises from low to high, positive edge-triggered flip-flop 12 may be triggered to latch data at its input.

Signal CLK may be coupled to the clock input of flip-flop 14 through delay circuit 12'. Delay circuit (flip-flop) 12' may serve as a buffer that delays signal CLK by a time delay that is equal to the clock-to-output delay of flip-flop 12. Delay circuit 12' may have a data input that is connected to a positive power supply line 18 (e.g., a positive power supply terminal on which positive power supply voltage Vcc is provided), a clock input that receives signal CLK, and a data output that is connected to the clock input of flip-flop 14 through line 11'. A delayed version of signal CLK (e.g., delayed signal CLK') may be provided over line 11'.

Delay circuit 12' may have the same transistor arrangement (e.g., physical layout) as flip-flop 12. Delay circuit 12' may therefore sometimes be referred to as a "replica" of flip-flop 12. Using delay circuit 12' as a delay matching circuit may accurately provide a delay that is equal to the clock-to-output delay of associated flip-flop 12. The clock-to-output delay and the delayed provided by delay matching circuit 12' will be matched even in the presence of process, temperature, and voltage variations, because the physical design of flip-flop circuits 12 and 12' are identical. Forming circuit 12' using the same layout as flip-flop 12 may also provided good matching in submicron effects such as length of diffusion (LOD), well proximity effect (WPE), oxide density (OD), oxide density spacing, poly density, etc., because circuits 12 and 12' will be subject to similar submicron effects.

Forming a delay circuit in this way also reduces design effort, because there is no need to design and tune the delay circuit. This design may therefore be easily portable across different process technologies, because there is no need to tune/calibrate delay circuit 12'.

Figure 5:
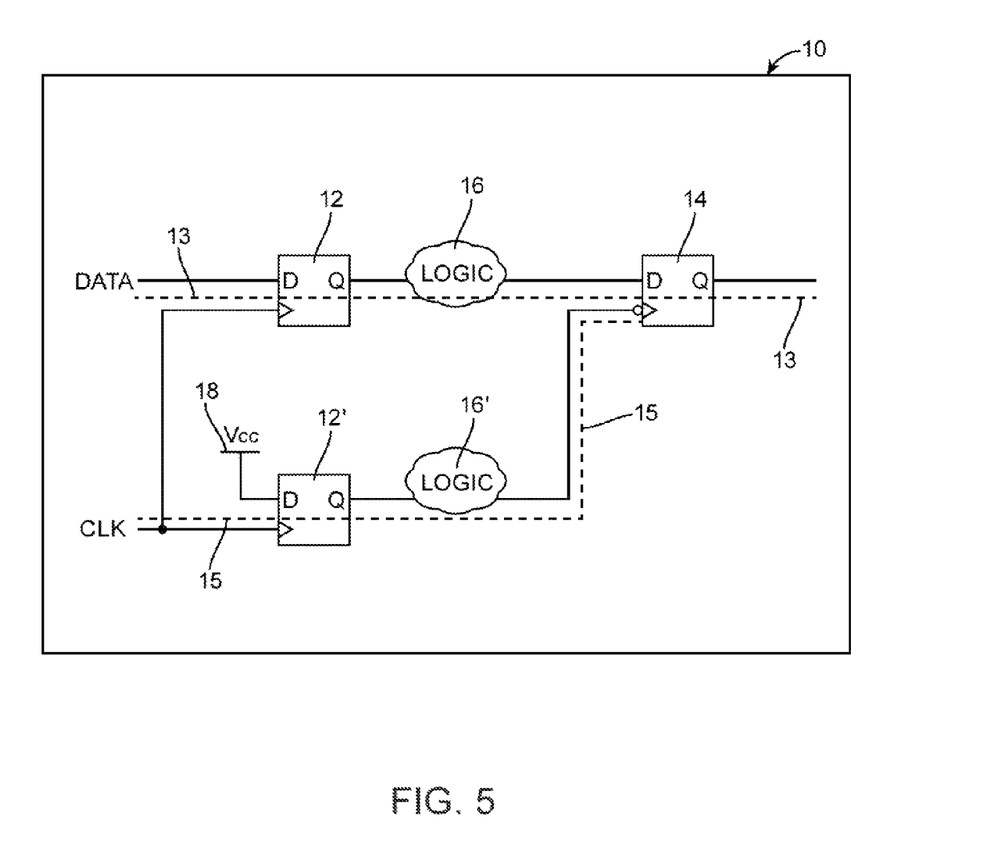

In some scenarios, a logic circuit may be interposed between two adjacent flip-flops in data path 13. As shown in FIG. 5, logic circuit 16 may be interposed between flip-flop 12 and flip-flop 14 (e.g., the data output of flip-flop 12 may be coupled to the data input of flip-flop 14 through logic circuit 16, so that the data input of flip-flop 14 receives signals from the output of logic circuit 16).

In this example, the delay circuit may further include a replica of logic circuit 16 such as logic circuit 16' in control path 15 (see, e.g., FIG. 5 in which the input of logic 16' receives signals from output Q of circuit 12' and provides signals from its output to the clock input of flip-flop 14). Forming a delay matching circuit in this way ensures that the total delay between flip-flops 12 and 14 (e.g., the sum of the clock-to-output delay and the propagation delay through logic circuit 16) is equal to the delay through the delay matching circuit (i.e., through delay circuit 12' and logic circuit 16').

The example of FIG. 5 is merely illustrative. Additional circuits may be interposed between two adjacent flip-flops in the data path. Any additional circuitry may be replicated in the clock control path as part of the delay matching circuitry to provide desired delay matching, if desired.

Figure 6:
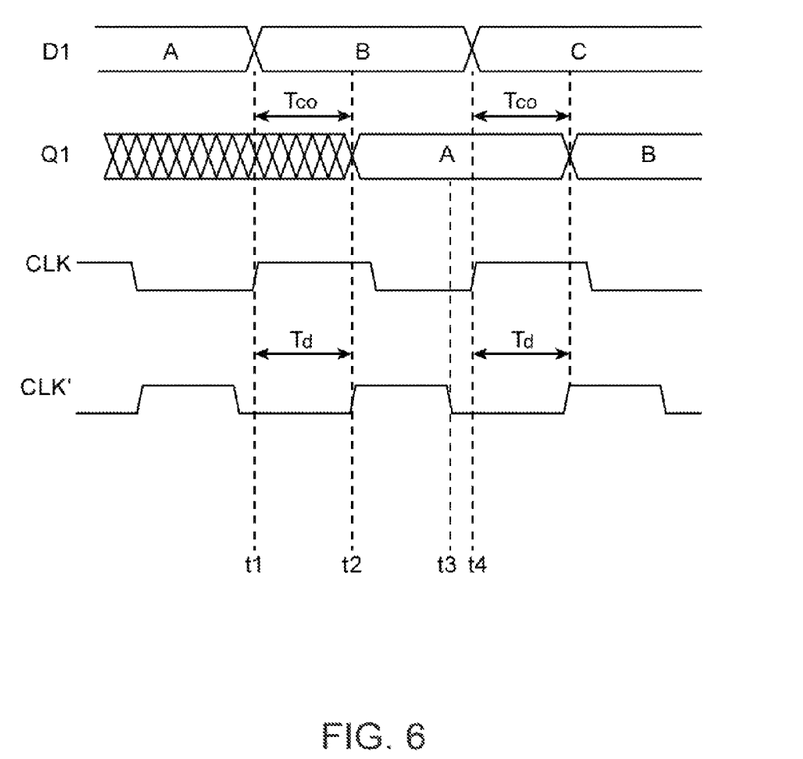
FIG. 6 is a timing diagram illustrating the behavior of relevant signals during operation of the flip-flops and delay matching circuitry of FIG. 4 in accordance with an embodiment of the present invention.

FIG. 6 is a timing diagram illustrating the behavior of relevant signals in the circuitry of FIG. 4. As shown in FIG. 6, data A may initially be presented at the data input of flip-flop 12 (e.g., signal D1 may initially have a value that is equal to A), and signal Q1 at the data output of flip-flop 12 is unknown. At time t1, clock signal CLK may clock high (e.g., CLK may rise from low to high) and may trigger flip-flop 12 to latch data A.

At time t2, signal Q1 may exhibit value A at the data output of flip-flop 12. The amount of delay from the rising edge of signal CLK to the time at which signal Q1 toggles to the new data value (e.g., the time delay between t1 and t2) may sometimes be referred to as clock-to-output delay Tco. Signal CLK may be delayed by time Td to produce delayed clock signal CLK' at the output of delay circuit 12' (FIG. 4). Delay Td may be well matched with clock-to-output delay Tco (see, e.g., FIG. 6).

At time t3, delayed signal CLK' clocks low (e.g., CLK' falls from high to low) and may trigger flip-flop 14 to properly latch data A at its input, because signal Q1 at the data input of flip-flop 14 may be stable (well-defined) for a period of time around time t3 (e.g., flip-flop 14 has sufficient setup and hold times). At time t4, a new clock cycle begins to latch successive data value B.

Configuring communications circuitry with delay matching circuitry in this way may enable the communications circuitry to operate properly at high data rates (e.g., a data rate of 10 Gbps or higher, 20 Gbps or higher, 30 Gbps or higher, etc.). The circuitry of FIGS. 4 and 5 may operate properly to transfer data even in the presence of systematic, environmental, and process variations, because the delay matching circuitry (e.g., circuit 12') provides a clock delay that accurately tracks the clock-to-output delay and any additional propagation delay in the data path across different operating conditions.

Figure 7:
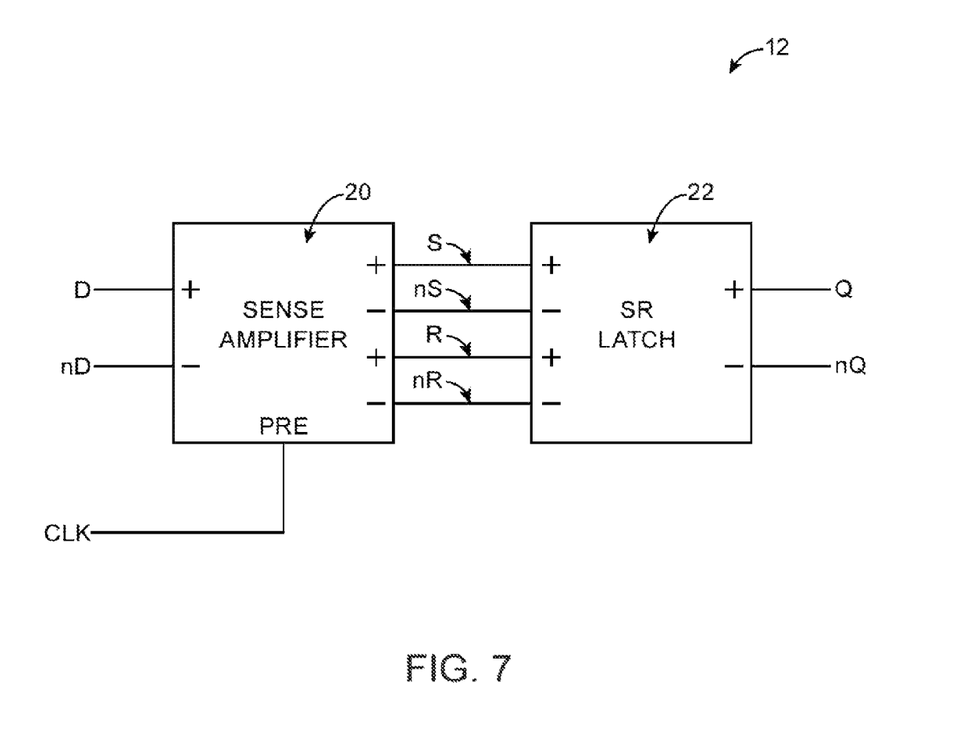
FIG. 7 is a block diagram of an illustrative differential sense-amplifier flip-flop in accordance with an embodiment of the present invention.

Flip-flops 12, 14, and 12' may be dynamic sense-amplifier flip-flops. Flip-flops 12, 14, and 12' may be differential circuits (e.g., circuits that have differential inputs and differential outputs). FIG. 7 is a block diagram that shows one possible implementation of a dynamic sense-amplifier flip-flop. As shown in FIG. 7, flip-flop 12 may include a sense amplifier such as sense amplifier (SA) 20 connected in series with a latch such as set-reset (SR) latch 22.

Differential flip-flop 12 may have differential inputs that receive input signals D and nD, differential outputs that output signals Q and nQ, and a control input that receives signal CLK. Amplifier 20 may have a first (positive) input that receives signal D, a second (negative) input that receives signal nD, a precharge control input that receives signal CLK, and first, second, third, and fourth outputs. Set signals S and nS may respectively be provided at the first and second outputs, whereas reset signals R and nR may be repeatedly provided at the third and fourth outputs. Set signals S and nS may have opposite values (i.e., nS is an inverted version of S). For example, if signal S has a logic value of "1," signal nS will have a logic value of "0," vice versa. Similarly, reset signals R and nR may have opposite values (i.e., nR is an inverted version of R). For example, if signal R has a logic value of "0," signal nR will have a logic value of "1," vice versa.

SR latch 22 may have a first input that receives signal S from the first output of amplifier 20, a second input that receives signal nS from the second output of amplifier 20, a third input that receives signal R from the third output of amplifier 20, and a fourth input that receives signal nR from the fourth output of amplifier 20 (see, e.g., FIG. 7). Latch 22 may have a first output that generates signal Q and a second output that generates signal nQ.

Figure 8:
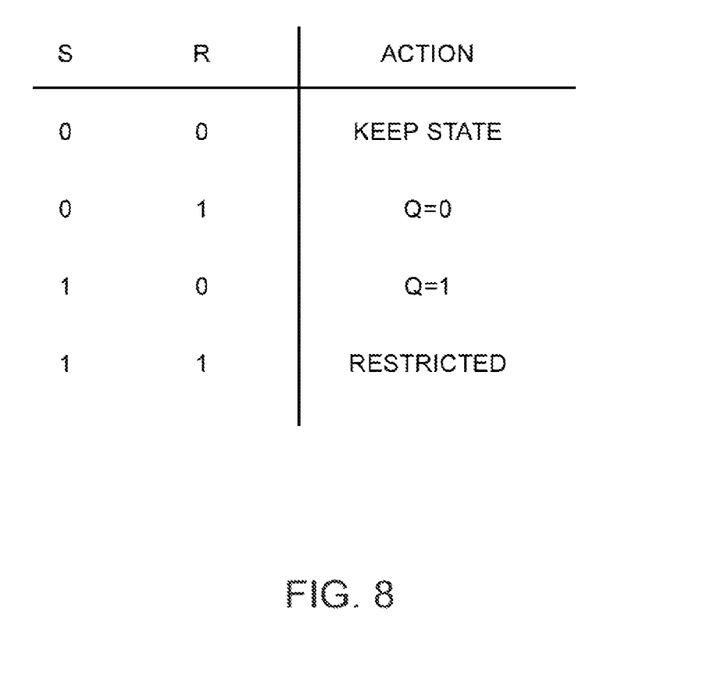
FIG. 8 is a table showing different possible settings for an SR latch in accordance with an embodiment of the present invention.

Sense amplifier 20 may be operative in two different phases. During a first phase (e.g., a high clock phase during which signal CLK is low), amplifier 20 may operate in a precharge phase in which the first and third outputs are driven low (i.e., S and R are driven low while nS and nR are driven high). As shown in the table of FIG. 8, this particular configuration of SR latch 22 enables latch 22 to hold its current value (e.g., to maintain its current state).

During a second phase (e.g., when signal CLK is high), amplifier 20 may operate in an evaluation phase. If signal D is greater than signal nD during the evaluation phase, the first output of amplifier 20 will be driven high, whereas the third output of amplifier 20 will be driven low (i.e., S is driven high while R is driven low). This arrangement will result in a high signal at the output of latch 22 (e.g., Q is high while nQ is low). If signal D is less than signal nD during the evaluation phase, the first output of amplifier 20 will be driven low, whereas the third output of amplifier 20 will be driven high (i.e., S is driven low while R is are driven high). This arrangement will result in a low signal at the output of latch 22 (e.g., Q is low while nQ is high). Generally, circuit 12 will pass a positive differential signal to its output or will pass negative differential signal to its output after a certain clock-to-output delay during the evaluation phase. Circuit 12 configured using the arrangement of FIG. 7 may therefore behave like a flip-flop.

Figure 9:
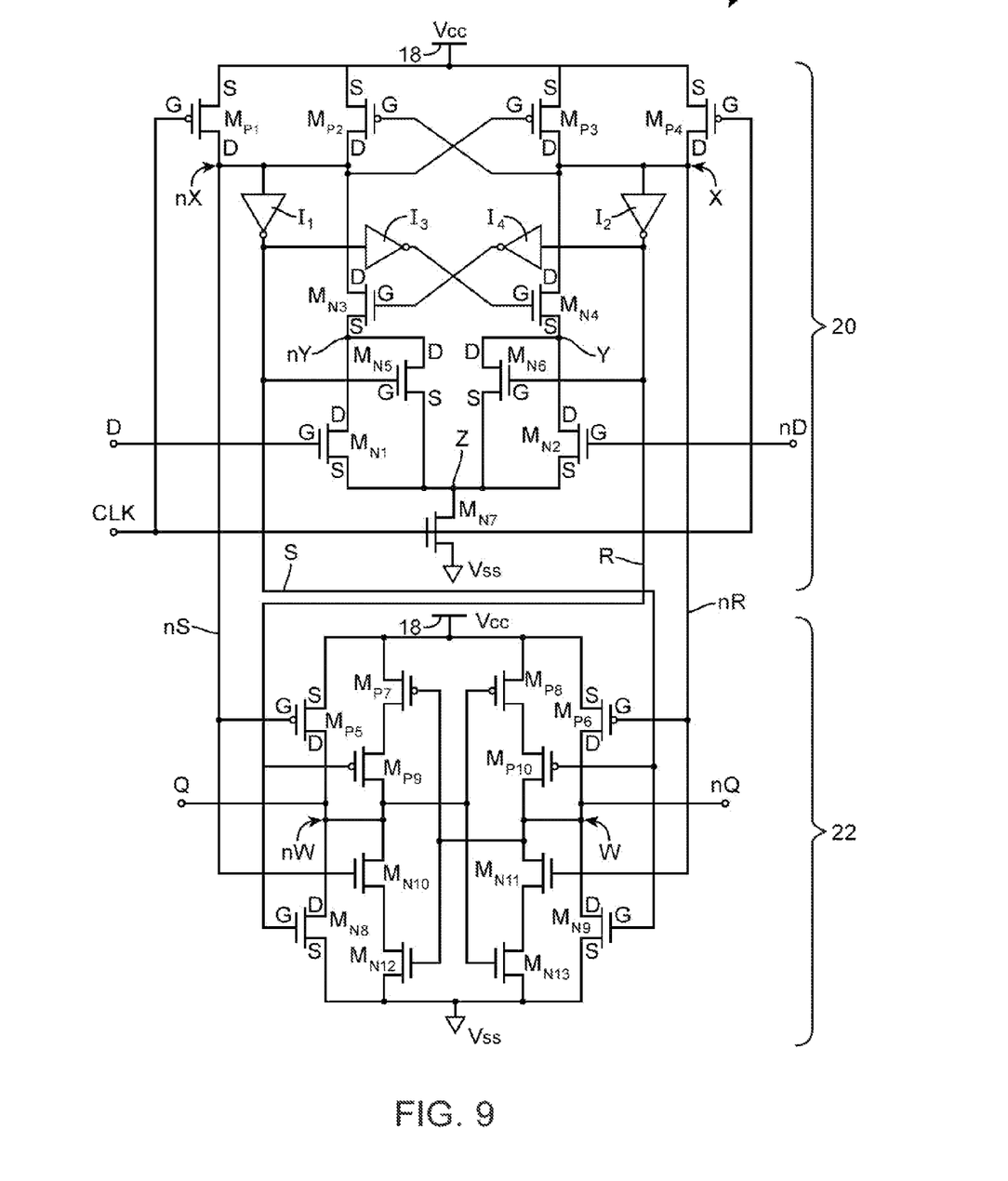
FIG. 9 is a circuit diagram of the sense-amplifier flip-flop of the type shown in FIG. 7 in accordance with an embodiment of the present invention.

FIG. 9 is an illustrative circuit diagram of flip-flop 12. In this example, flip-flop 12 has been implemented using a well-known sense-amplifier/SR-latch flip-flop design. Other types of flip-flop architectures may be used if desired.

As shown in FIG. 9, sense amplifier 20 may include p-channel transistors $M_{P1}$-$M_{P4}$ and n-channel transistors $M_{N1}$-$M_{N7}$. Transistors $M_{P1}$ and $M_{P2}$ may have source terminals that are connected to positive power supply line 18 and drain terminals that are connected to node nX, whereas transistors $M_{P3}$ and $M_{P4}$ may have source terminals that are connected to line 18 and drain terminals that are connected to node X. Transistor $M_{P2}$ may have a gate that is connected to the drain terminal of transistor $M_{P3}$, whereas transistor $M_{P3}$ may have a gate that is connected to the drain terminal of transistor $M_{P2}$. Precharge transistors $M_{P1}$ and $M_{P2}$ may each have a gate that is controlled by precharge control signal CLK. The source and drain terminals may sometimes be used interchangeably and may therefore be referred to as source-drain terminals.

Node nX may be connected to an input of inverter $I_1$, whereas node X may be connected to an input of inverter $I_2$. Inverter $I_1$ may have an output that is connected to an input of inverter $I_3$, whereas inverter $I_2$ may have an output that is connected to an input of inverter $I_4$. N-channel transistor $M_{N3}$ may have a drain terminal that is connected to node nX, a source terminal that is connected to node nY, and a gate that is connected to an output of inverter $I_4$. N-channel transistor $M_{N4}$ may have a drain terminal that is connected to node X, a source terminal that is connected to node Y, and a gate that is connected to an output of inverter $I_3$.

N-channel transistor $M_{N5}$ may have a drain terminal that is connected to node nY, a source terminal that is connected to tail node Z, and a gate that is connected to the output of inverter $I_1$. N-channel transistor $M_{N6}$ may have a drain terminal that is connected to node Y, a source terminal that is connected to node Z, and a gate that is connected to the output of inverter $I_2$. N-channel transistor $M_{N1}$ may have a drain terminal that is connected to node nY, a source terminal that is connected to node Z, and a gate that receives input signal D (e.g., the gate of transistor $M_{N1}$ may serve as the positive input of amplifier 20). N-channel transistor $M_{N2}$ may have a drain terminal that is connected to node Y, a source terminal that is connected to node Z, and a gate that that receives input signal nD (e.g., the gate of transistor $M_{N2}$ may serve as the negative input of amplifier 20).

N-channel transistor $M_{N7}$ may be connected between tail node Z and a ground power supply line (e.g., a ground line over which ground power supply voltage Vss is provided) and may have a gate that is controlled by signal CLK.

The output of inverter $I_1$ may serve as the first output of amplifier 20 (i.e., an output that produces signal S), whereas the output of inverter $I_2$ may serve as the third output of amplifier 20 (i.e., an output that produces signal R). Node nX may serve as the second output of amplifier 20 (i.e., an output that produces signal nS), whereas node X may serve as the fourth output of amplifier 20 (i.e., an output that produces signal nR).

As shown in FIG. 9, SR latch 22 may include p-channel transistors $M_{P5}$-$M_{P10}$ and n-channel transistors $M_{N8}$-$M_{N13}$. Transistor $M_{P5}$ may have a source terminal that is connected to positive power supply line 18, a drain terminal that is connected to node nW, and a gate that is connected to node nX, whereas transistor $M_{P6}$ may have a source terminal that is connected to line 18, a drain terminal that is connected to node W, and a gate that is connected to node X. Flip-flop output signal Q may be provided at node nW, whereas flip-flop output signal nQ may be provided at node W.

Transistors $M_{P7}$ and $M_{P9}$ may be connected in series between line 18 and node nW, whereas transistors $M_{P8}$ and $M_{P10}$ may be connected in series between line 18 and node W. Transistor $M_{P7}$ may have a gate that is connected to node W, whereas transistor $M_{P8}$ may have a gate that is connected to node nW. Transistor $M_{P9}$ may have a gate that is connected to the output of inverter $I_2$, whereas transistor $M_{P10}$ may have a gate that is connected to the output of inverter $I_1$.

Transistor $M_{N8}$ may have a drain terminal that is connected to node nW, a source terminal that is connected to the ground line, and a gate that is connected the output of inverter $I_2$, whereas transistor $M_{N9}$ may have a drain terminal that is connected to node W, a source terminal that is connected to the ground line, and a gate that is connected to the output of inverter $I_1$. Transistors $M_{N10}$ and $M_{N12}$ may be connected in series between node nW and the ground line, whereas transistors $M_{N11}$ and $M_{N13}$ may be connected in series between node W and the ground line. Transistor $M_{N10}$ may have a gate that is connected to node nX, whereas transistor $M_{N11}$ may have a gate that is connected to node X. Transistor $M_{N12}$ may have a gate that is connected to node W, whereas transistor $M_{N13}$ may have a gate that is connected to node nW.

Figure 10:
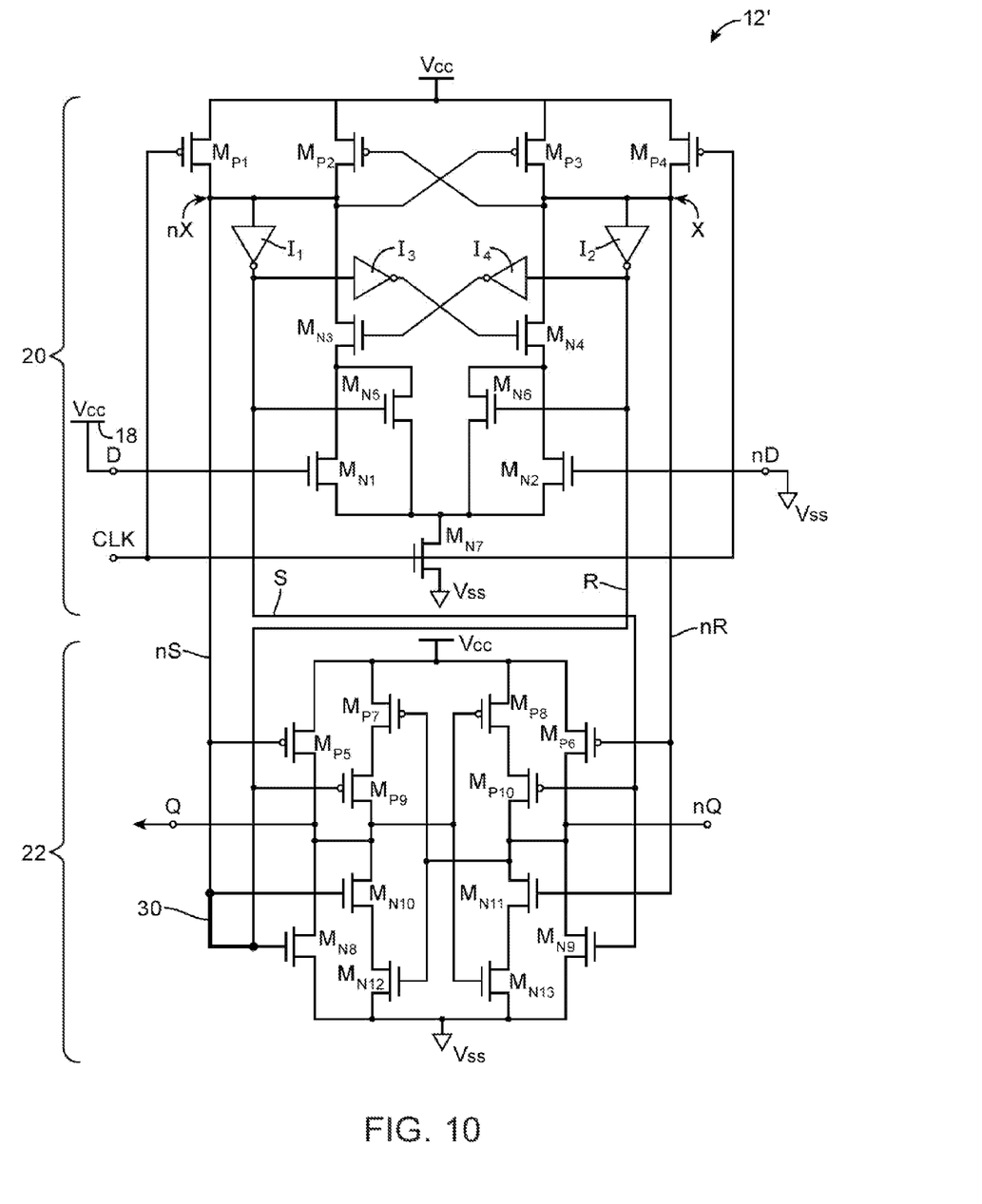
FIG. 10 is a circuit diagram of an illustrative delay matching circuit in accordance with an embodiment of the present invention.

The circuit diagram of delay circuit 12' is shown in FIG. 10. Delay circuit 12' may serve as a buffer circuit that receives clock signal CLK and generates delayed clock signal CLK'. The delay between clock signal CLK and delayed clock signal CLK' may be equal to clock-to-output delay Tco of flip-flop 12.

As shown in FIG. 10, the positive input of sense amplifier 20 may be connected to positive power supply line (e.g., signal D may be driven to positive power supply voltage Vcc), whereas the negative input of amplifier 20 may be connected to the ground line (e.g., signal nD may be driven to ground voltage Vss). Node nX may be shorted to the output of inverter $I_2$, as shown by bolded line 30 in FIG. 10. Connected using this arrangement, the signal on node nX (i.e., signal nS) is forced to be equal to the signal at the output of inverter $I_2$ (i.e., signal R). Signal S will therefore have an inverted value relative to signal R, because signal R is forced to be equal to the inverted version of signal S. For example, if signal R is high, signal S will be low. If signal R is low, signal S will be high.

Figure 11:
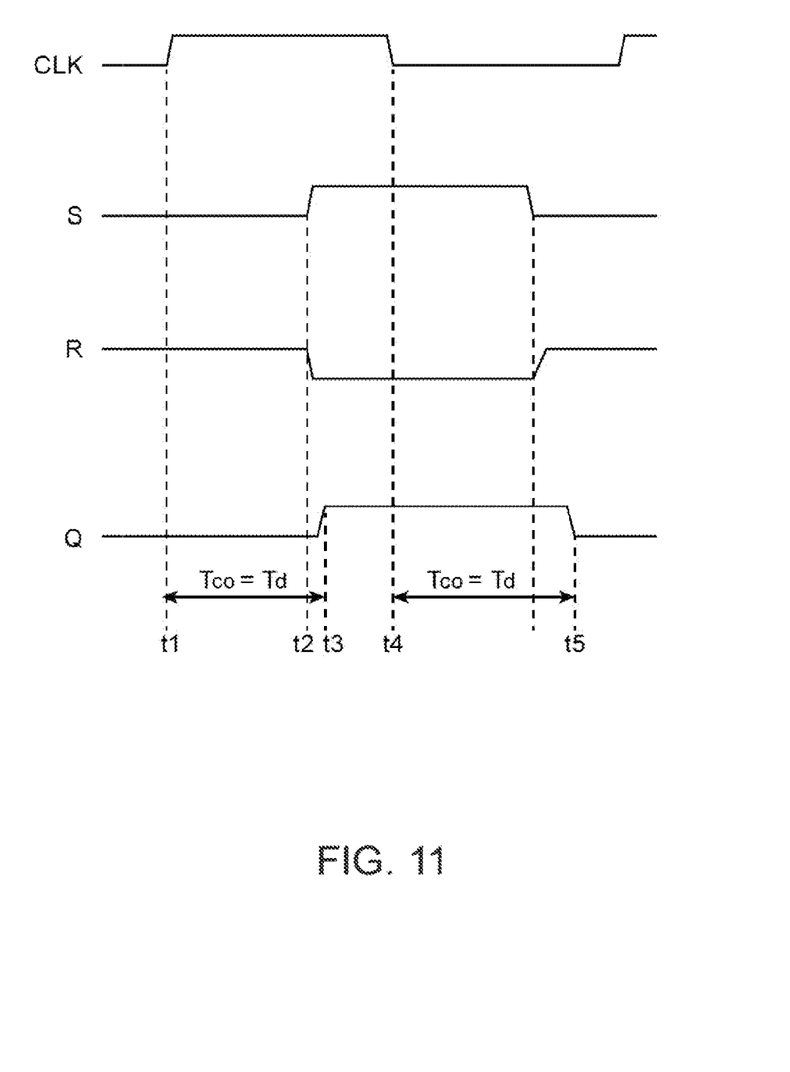
FIG. 11 is a timing diagram illustrating the behavior of relevant signals during operation of the delay matching circuitry of FIG. 10 in accordance with an embodiment of the present invention.

FIG. 11 is a timing diagram showing the behavior of relevant signals during operation of delay buffer circuit 12'. Signal CLK may initially be low (prior to time t1). When CLK is low, precharge transistors $M_{P1}$ and $M_{P4}$ are turned on to pull nodes nX and X high, respectively. If node nX is high, inverter $I_2$ will drive signal S low. If node X is high, inverter $I_2$ will attempt to pull signal R low. Signal R will, however, stay high because the third latch input is shorted to node nX through line 30. Connected in this way, transistor MP1 may overpower inverter $I_2$ to keep signal R high. If set signal S is low and reset signal R is high, signal Q of SR latch 22 will be low, as shown in FIG. 11.

At time t1, signal CLK may rise from low to high. This may trigger sense amplifier 20 to evaluate the signals at its inputs. Node nX may eventually be driven low through transistor $M_{N1}$ because transistor $M_{N1}$ is turned on by a high input signal D. Node X may stay high because transistor $M_{N2}$ is turned off by a low input signal nD.

At time t2, a low signal at node nX will enable inverter $I_2$ to pull set signal S high. A high signal at node X will enable inverter $I_2$ to pull reset signal R low now that precharge transistor $M_{P1}$ is turned off during the low clock phase. If set signal S is high and reset signal R is low, signal Q of latch 22 will be raised high (see, e.g., FIG. 11).

At time t3, signal Q of SR latch 22 rises from low to high. The time delay (Td) from the rising edge of signal CLK and the rising edge of signal Q is therefore inherently equal to clock-to-output delay of flip-flop 12.

At time t4, signal CLK clocks low. After another clock-to-output delay Tco, the signal at output Q falls from high to low (time t5). As shown in FIG. 11, signal Q of SR latch 22 may be a delayed version of signal CLK'. The amount of delay provided by delay matching circuit 12' may track and match the clock-to-output delay of associated flip-flop 12.

The delay matching circuitry described herein is merely illustrative. If desired, additional circuitry may be included in the clock path to provide the desired clock delay.

Figure 12:
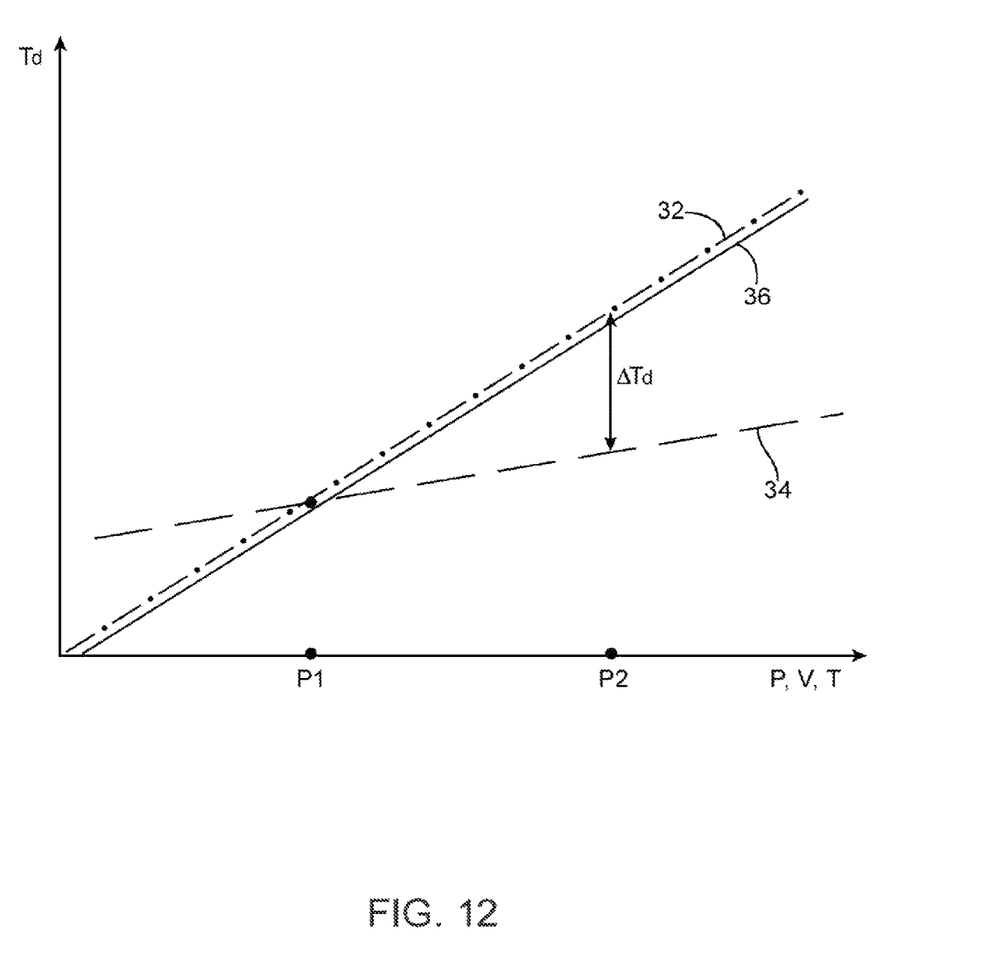
FIG. 12 is a graph showing how a flip-flop-like delay circuit may have timing properties that accurately track flip-flops in an integrated circuit across variations in process, voltage, and temperature in accordance with an embodiment of the present invention.

The graph of FIG. 12 shows how a flip-flop-like delay circuit may have timing properties that accurately track flip-flops in an integrated circuit across variations in process, voltage, and temperature. In the graph of FIG. 12, solid line 36 represents the amount of clock-to-output delay that is exhibited by flip-flop circuits such as flip-flop circuit 12 (and 14) as a function of changes in process, voltage, and temperature (P, V, and T). Dashed-and-dotted line 32 represents the amount of delay Td that is exhibited by flip-flop-like delay circuit 12'. Dashed line 34 represents that amount of delay Td that is exhibited by a conventional delay circuit formed from series-connected inverters 8 of FIG. 3.

As shown in FIG. 12, at a set of PVT values such as PVT values P1, the delay Td exhibited by a conventional circuit such as the inverter-based delay circuit of FIG. 3 and the delay exhibited by circuit 12' may both satisfactorily match the clock-to-output delay exhibited by flip-flop 12. However, at a different set of PVT values such as PVT values P2 (e.g., at a higher or lower temperature, a higher or lower operating voltage, or when a circuit has been fabricated with a different set of process conditions than those associated with set P1), only delay circuit 12' will exhibit a delay Td that tracks the delay of flip-flop 12. The conventional delay circuit of FIG. 3 will exhibit a delay time Td that differs significantly from that of flip-flop 12, as indicated by time difference ΔTd. Because delay circuit 12' has a design that is close to that of flip-flop 12, the timing properties of delay circuit 12' will more closely follow the timing properties of flip-flop 12 across variations in process, voltage, and temperature (so-called PVT variations) than conventional circuits.

For optimum delay time tracking, delay circuit 12' may be fabricated with properties that match those of flip-flop 12. Examples of attributes that may be matched between flip-flop 12 and delay circuit 12' include: the number of transistors (i.e., use of an identical number of transistors in flip-flops 12 and in delay circuit 12' so that the transistor count of flip-flop 12 is identical to the transistor count of delay circuit 12'), the size and shapes of the transistors (i.e., gate widths, gate lengths, diffusion sizes and concentrations for sources and drains and other transistor structures, gate insulator thicknesses and material, conductor line widths, etc.), the size and shapes of the interconnect lines between transistors (with the exception of segment 30 of FIG. 10), the types of metals or other conductive materials used in the interconnect lines, the layout of the circuit (e.g., the spacing between components and the size and shapes of the components), the type of process used to form circuit components (i.e., implantation, oxide growth, metal deposition, etc.), etc.

Optimum delay time tracking may be achieved by using the same type of circuit architecture delay circuit 12' and flip-flop 12. For example, delay circuit 12' may be formed using the same types of cascaded logic circuits that are used in flip-flops 12. As described in connection with FIGS. 9 and 10, for example, flip-flop 12 may have a first stage such as a sense-amplifier stage (circuit 20) and a cascaded (series-connected) second stage such as a set-reset (SR) latch. Satisfactory delay time tracking may be achieved by ensuring that delay circuit 12' has the same types of first and second stages (e.g., a first stage that is implemented using a sense amplifier and a second stage that is formed using an SR latch).

The foregoing is merely illustrative of the principles of this invention and various modifications can be made by those skilled in the art without departing from the scope and spirit of the invention.

What is claimed is:

1. Circuitry, comprising:
a first flip-flop having a data input, a data output, and a clock input;
a second flip-flop having a data input, a data output, and a clock input, wherein the data input of the second flip-flop receives data from the data output of the first flip-flop; and
a clock delay circuit that is a replica of the first flip-flop, wherein the clock delay circuit has a data input corresponding to the data input of the first flip-flop, a data output, and a clock input corresponding to the clock input of the first flip-flop, wherein the clock input of the clock delay circuit receives a clock signal, wherein the clock input of the first flip-flop receives the clock signal, wherein the data output of the clock delay circuit provides a delayed version of the clock signal to the clock input of the second flip-flop, wherein the clock signal received at the clock input of the first flip-flop passes through a first number of circuits in the first flip-flop to the data output of the first flip-flop, wherein the clock signal received at the clock input of the clock delay circuit passes through a second number of circuits in the clock delay circuit to the data output of the clock delay circuit, and wherein the second number of circuits is equal to the first number of circuits.

2. The circuitry defined in claim 1 further comprising a clock terminal that provides the clock signal to the clock input of the clock delay circuit and to the clock input of the first flip-flop.

3. The circuitry defined in claim 2 further comprising a power supply terminal that provides a power supply signal to the data input of the clock delay circuit.

4. The circuitry defined in claim 3 wherein the power supply terminal comprises a positive power supply terminal that provides a positive power supply voltage to the data input of the clock delay circuit.

5. The circuitry defined in claim 1 wherein the first flip-flop includes first and second series-connected stages of respective first and second types and wherein the delay circuit includes first and second series-connected stages of identical first and second types.

6. The circuitry defined in claim 5 wherein the first type comprises a sense amplifier circuit type and wherein the second type comprises an SR latch type.

7. The circuitry defined in claim 1 wherein the first flip-flop comprises a sense amplifier circuit and wherein the delay circuit comprises a sense amplifier circuit.

8. The circuitry defined in claim 7 wherein the first flip-flop comprises a latch connected in series with the sense amplifier circuit in the first flip-flop and wherein the delay circuit comprises a latch connected in series with the sense amplifier circuit in the delay circuit.

9. The circuitry defined in claim 1 wherein one of the first and second flip-flops comprises a positive edge-triggered flip-flop, wherein the other of the first and second flip-flops comprises a negative edge-triggered flip-flop and wherein the delay circuit comprises a set-reset latch.

10. Circuitry, comprising:
a first flip-flop having a data input, a data output, and a clock input;
a second flip-flop having a data input, a data output, and a clock input, wherein the data input of the second flip-flop receives data from the data output of the first flip-flop; and
a clock delay circuit that is a replica of the first flip-flop, wherein the clock delay circuit has a data input corresponding to the data input of the first flip-flop, a data output, and a clock input corresponding to the clock input of the first flip-flop, wherein the clock input of the clock delay circuit receives a clock signal, wherein the data output of the clock delay circuit provides a delayed version of the clock signal to the clock input of the second flip-flop, wherein the first flip-flop comprises a sense amplifier circuit and a set-reset latch, and wherein the clock delay circuit comprises a sense amplifier circuit and a set-reset latch.

11. The circuitry defined in claim 10 wherein one of the first and second flip-flops comprises a positive edge-triggered flip-flop and wherein the other of the first and second flip-flops comprises a negative edge-triggered flip-flop.

12. Circuitry, comprising:
a flip-flop having a data input, a data output, and a clock input, wherein the first flip-flop circuit is characterized by a clock-to-output delay time;
a circuit having a data input, a data output, and a clock input, wherein the data input of the circuit receives data from the data output of the flip-flop; and
a clock delay circuit having a data input, a data output, and a clock input, wherein the clock input of the clock delay circuit receives a clock signal, wherein the data output of the clock delay circuit provides a delayed version of the clock signal to the clock input of the circuit, wherein the delayed version of the clock signal is delayed with respect to the clock signal at the clock input of the clock delay circuit by a delay time that matches the clock-to-output delay time, and wherein the clock delay circuit comprises a sense amplifier circuit.

13. The circuitry defined in claim 12 wherein the clock delay circuit further comprises a set-reset latch.

14. The circuitry defined in claim 12 wherein the clock delay circuit further comprises a set-reset latch connected in series with the sense amplifier circuit.

15. The circuitry defined in claim 12 wherein the flip-flop and the clock delay circuit have identical transistor counts.

16. The circuitry defined in claim 12 wherein the circuit comprises a flip-flop circuit.

17. The circuitry defined in claim 12 wherein the sense amplifier circuit comprises a differential sense amplifier circuit.

18. Circuitry, comprising:
a first flip-flop having a differential data input, a data output, and a clock input;
a second flip-flop having a data input, a data output, and a clock input;
a logic circuit that receives signals from the data output of the first flip-flop and that has a first output at which corresponding output signals are provided;
a replica of the logic circuit; and
a clock delay circuit having a differential data input that corresponds to the differential data input of the first flip-flop, a data output, and a clock input that corresponds to the clock input of the first flip-flop, wherein the differential data input of the clock delay circuit receives a constant power supply voltage signal, wherein the clock input of the clock delay circuit receives a clock signal, wherein the data output of the clock delay circuit provides a delayed version of the clock signal to the replica, wherein the replica has a second output, wherein the first output is connected to the data input of the second flip-flop, wherein the second output is connected to the clock input of the second flip-flop.

19. The circuitry defined in claim 18 wherein the first flip-flop and the clock delay circuit have identical transistor counts.

20. The circuitry defined in claim 18 wherein the first flip-flop comprises a sense amplifier and a set-reset latch and wherein the clock delay circuit comprises a sense amplifier and a set-reset latch.

* * * * *